(12) United States Patent
Visconti et al.

(10) Patent No.: US 12,094,512 B2
(45) Date of Patent: Sep. 17, 2024

(54) DIGIT LINE VOLTAGE BOOSTING SYSTEMS AND METHODS

(71) Applicant: Micron Technology, Inc., Boise, ID (US)

(72) Inventors: Angelo Visconti, Gentile (IT); Andrea Locatelli, Dalmine (IT)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 17/896,345

(22) Filed: Aug. 26, 2022

(65) Prior Publication Data
US 2024/0071457 A1   Feb. 29, 2024

(51) Int. Cl.
*G11C 11/22* (2006.01)

(52) U.S. Cl.
CPC ........ *G11C 11/2295* (2013.01); *G11C 11/221* (2013.01); *G11C 11/2259* (2013.01); *G11C 11/2273* (2013.01); *G11C 11/2293* (2013.01); *G11C 11/2297* (2013.01)

(58) Field of Classification Search
CPC .............. G11C 11/2295; G11C 11/221; G11C 11/2293; G11C 11/2297
See application file for complete search history.

(56) References Cited

U.S. PATENT DOCUMENTS

| | | |
|---|---|---|
| 10,446,214 B1 | 10/2019 | Di Vincenzo et al. |
| 10,607,676 B2 | 3/2020 | Di Vincenzo |
| 10,896,712 B2 | 1/2021 | Visconti et al. |
| 10,964,372 B2 | 3/2021 | Visconti et al. |
| 10,984,847 B2 | 4/2021 | Visconti |
| 11,074,956 B1 | 7/2021 | Vo et al. |
| 11,127,449 B2 | 9/2021 | Vo et al. |
| 2021/0304812 A1 | 9/2021 | Locatelli et al. |
| 2022/0068399 A1* | 3/2022 | Cho ........................ G11C 16/24 |

* cited by examiner

*Primary Examiner* — Jay W. Radke
(74) *Attorney, Agent, or Firm* — Fletcher Yoder, P.C.

(57) ABSTRACT

Systems and methods described herein may enable a memory system to selectively provide a signal boost to a memory cell in response to a change in operating condition, like a change in temperature. The systems and methods may include determining to generate a signal boost for a first duration of time and in response to determining to generate the signal boost, generating the signal boost causing an increase in voltage applied to a signal line coupled to a memory cell. The systems and methods may further include, after the first duration of time, ceasing generation of the signal boost.

20 Claims, 4 Drawing Sheets

DIGIT LINE VOLTAGE BOOSTING SYSTEMS AND METHODS

BACKGROUND

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

The following relates generally to memory devices. The techniques and methods described herein may be used with ferroelectric memory devices or other types of memory devices that are to be periodically refreshed. Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory (e.g., flash memory) can store data for extended periods of time even in the absence of an external power source. Volatile memory devices (e.g., DRAM) may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous. Some of the memory devices include memory cells that may be accessed by turning on a transistor that couples the memory cell (e.g., the capacitor) with a wordline or a bitline.

FeRAM may use similar device architectures as a volatile memory but may have non-volatile properties due to the use of a ferroelectric capacitor as a storage device. FeRAM devices may thus have improved performance compared to some other non-volatile and volatile memory devices.

Keeping the foregoing in mind, a FeRAM memory cell may be accessed as part of a memory operation. To do so, one or more signals are transmitted to the FeRAM memory cell. Changes in ambient environmental conditions, such as temperature, or aging over time, may change how the FeRAM memory cell responds to the one or more signals. Indeed, over time or in different ambient environmental conditions, such as when an ambient temperature cools, a signal that accesses the FeRAM memory cell, and thus resulting access speeds, may not be suitable after conditions change.

BRIEF DESCRIPTION OF THE DRAWINGS

Various aspects of this disclosure may be better understood upon reading the following detailed description and upon reference to the drawings in which.

DETAILED DESCRIPTION

Figure 1:
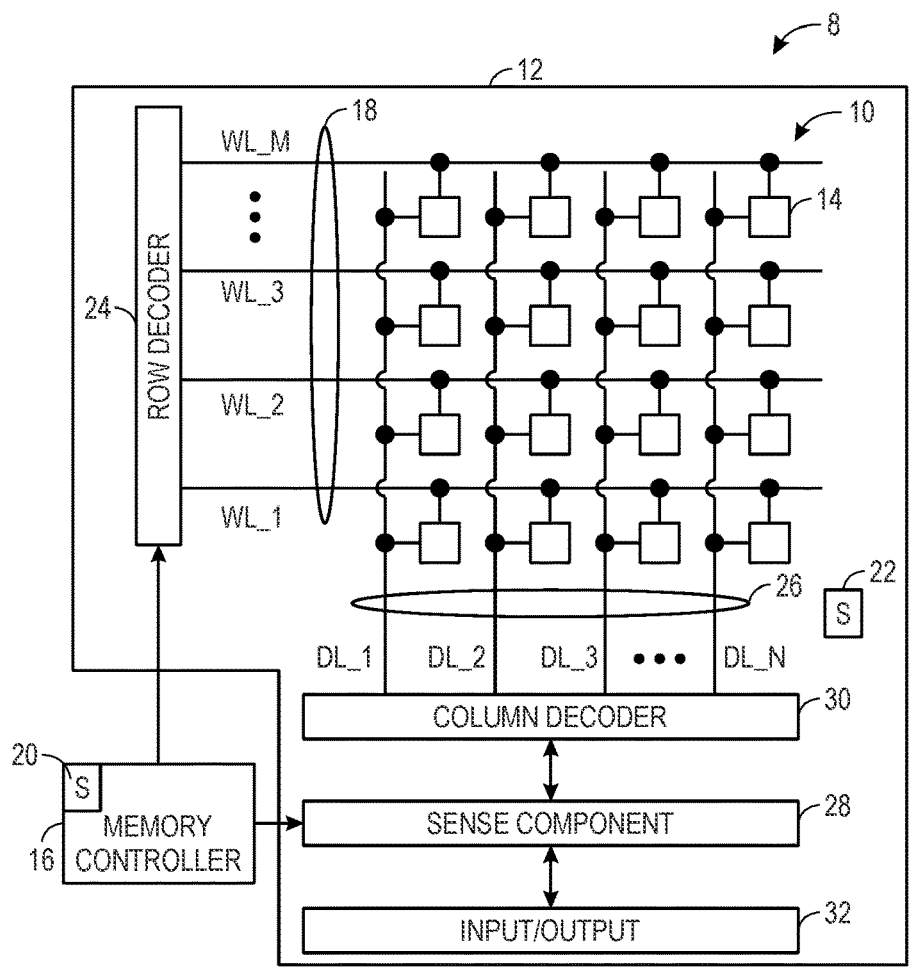
FIG. 1 illustrates an example of a memory array, in accordance with an embodiment of the present disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Different memories may use different memory architectures to store and retrieve data bits using different memory states. In some embodiments, each memory state may refer to a distinct distribution of charges on a memory cell. For example, each memory cell of a ferroelectric random access memory (FeRAM) may include a ferroelectric capacitor including ferroelectric material. The ferroelectric capacitor may store memory states using charge dipoles of the memory cell (e.g., positive and negative charge distributions). A state of such memory cells may be written to or read from by applying a voltage. In specific embodiments, the applied voltage may flip the memory cell dipole. Such memory cells may use a reference voltage, as a threshold, to distinctively identify whether a positive or negative charge distribution (e.g., dipole) is being written or sensed. In some embodiments, an intermediary memory state (e.g., third memory state) may be programmed and sensed using an intermediary charge distribution between the positive and negative charge distributions. Indeed, some memory cells may include two reference voltages and store and sense three distinct memory states.

Keeping the foregoing in mind, a FeRAM memory may include one or more memory cells that may be periodically accessed to read or write data. However, the FeRAM memory access speeds may slow in lower operating temperatures when compared to speeds at higher temperatures. When left unmitigated, the FeRAM may suffer data loss due to switching speed-based alterations. That is, a FeRAM memory controller may expect one switching speed and complete an access operation before an accurate data value is output from the one or more memory cells (since access speeds may slow in lower temperatures), thereby causing propagation of incorrect data as a result of the access operation.

To remedy this, switchable voltage booster systems and methods are described herein. A memory device may include a switchable voltage booster coupled to the one or more memory cells and configurable to provide a booster voltage signal to the memory cell during a portion of an access operation (e.g., during an initial read operation). A memory controller of the memory device may selectively use the switchable voltage booster in response to temperature changes, or other conditions (e.g., process conditions, environmental conditions, material conditions), to change access speeds on-the-fly, or in response to conditions present at that time.

In some cases, the switchable voltage booster may change a shape and/or amplitude of the voltage signal applied to the one or more cells (e.g., via a data line, via a digit line) to mitigate speed changes that may occur in response to the conditions. Indeed, the switchable voltage booster may tailor one or more properties (e.g., frequency, amplitude, timing, shape) of the voltage signal in response to one or more conditions being present.

By using the switchable voltage booster to selectively apply a transient boosting voltage to the one or more memory cells during a read phase when occurring simultaneous to one or more conditions, the memory device may experience faster cell access speeds, and thus an improved cell read window due to faster access speeds, enabling a shorter duration being used to access the memory cell. Using a shorter amount of time to access the memory cell may be desired due to the timing buffer it can add to subsequent operation timing. The memory device that uses the switchable voltage booster may be relatively more robust toward condition variability, which relates to cell kinetics and the reduction of variability that otherwise occurs in response to the one or more conditions. Improved cell robustness toward variability may improve system performance, even through changing conditions, as the memory device is better designed to shift its operations responsive to the changing conditions. Furthermore, the memory device that uses the switchable voltage booster in response to one or more conditions may improve cell robustness toward imprint (e.g., read robustness), which may in turn cause a larger window with optimized reading, limiting the effects of the reading window.

Moreover, device aging may lead to reduced accuracy in read data from memory since the access time period is greater than a window allocated for the operations. Since one cause of device wear out is the access timing exceeding a read window timing, the improvements to the cell access operational speed and the realization of the time buffer relative to a total access window may also improve device reliability and/or lifespan. Furthermore, since the switchable voltage booster may not apply the signal boost when conditions are present that do not affect access speeds, power consumption levels may be kept relatively low or steady despite the additional boosting to voltage signals.

Referring now to FIG. 1, a memory system 8 is illustrated in accordance with various examples of the present disclosure. The memory system 8 includes a memory array 10 that has a number of memory cells, including a memory cell 14, that are programmable to store different states, such as two, three, or more memory states. The memory cell 14 may be programmable with data having a voltage value that corresponds to a logical high binary data or to a logical low binary data.

A memory controller 16 may communicate with the memory device 12 to perform read operations, write operations, and refresh operations. The memory controller 16 may include a tangible, non-transitory computer readable medium programmed with instructions that, when executed by a processor, cause the memory controller 16 to perform operations described herein.

The memory cell 14 may include a capacitor that has a ferroelectric as the dielectric material to store a charge representative of the programmable states. For example, the capacitor may represent three memory states using three distinct charge levels.

Memory operations, such as reading and writing memory states, may be performed on the memory cell 14 by activating or selecting the appropriate word line 18 and digit line 26. Activating or selecting a word line 18 or a digit line 26 may include applying a voltage to the respective lines. Word lines 18 and digit lines 26 are made of conductive materials. For example, word lines 18 and digit lines 26 may be made of metals (such as copper, aluminum, gold, tungsten, etc.), metal alloys, other conductive materials, or the like. According to the example of FIG. 1, each row of the memory cells 14 is connected to a single word line 18, and each column of the memory cells 14 is connected to a single digit line 26.

By applying a voltage to the word line 18 and the digit line 26, a single memory cell 14 may be activated (or accessed) at their intersection. Accessing such memory cell 14 may include performing reading or writing operation on the memory cell 14. The intersection of a word line 18 and digit line 26 may be referred to as an address of a respective memory cell 14.

In some architectures, the memory state storage of the memory cell 14 (e.g., the capacitor) may be electrically isolated from the digit line by a selection component. The word line 18 may be connected to and may control the selection component. For example, the selection component may be a transistor and the word line 18 may be connected to the gate of the transistor. Activating the word line 18 results in an electrical connection or closed circuit between the capacitor of a memory cell 14 and its corresponding digit line 26. The digit line 26 may then be accessed to either read or write the memory cell 14. In some examples, the word line 18 may be activated multiple times to facilitate sensing. In some cases, the word line 18 may be activated a first time to facilitate sensing of a first charge of a first type (e.g., dielectric charge) and a second time to facilitate sensing of a second charge of a second type (e.g., polarization charge). In some cases, the first time and the second time may be discontinuous or separated in time.

Accessing the memory cell 14 may be controlled through a respective row decoder 24 and a respective column decoder 30. In some examples, a row decoder 24 receives a row address from the memory controller 16 and activates the appropriate word line 18 based on the received row address. Similarly, a column decoder 30 receives a column address from the memory controller 16 and activates the appropriate digit line 26. For example, memory array 10 may include multiple word lines 18, labeled WL_1 through WL_M, and multiple digit lines 26, labeled DL_1 through DL_N, where M and N depend on the array size. Thus, by activating a word line 18 and a digit line 26 (e.g., WL_2 and DL_3), the memory cell 14 at their intersection may be accessed.

Upon accessing, the memory cell 14 may be read, or sensed, by sense component 28 to determine the stored state of the memory cell 14. A capacitor of a targeted memory cell 14 may be discharged to induce a change in voltage of a corresponding digit line 26 to the targeted memory cell 14. The column decoder 30 may receive signals transmitted via the digit line 26 and may transmit the signals onto the sense component 28 for further processing. The sense component 28 may compare the signals to a reference voltage to determine the stored state of the targeted memory cell 14, where a voltage greater than a first reference voltage may indicate a logical high state and a voltage less than a second reference voltage may indicate a logical low state. In some cases, a single reference voltage may be used to differentiate between a logical high state and a logical low state, where a voltage greater than the single reference voltage indicates a logical high state and a voltage less than or equal to the single reference voltage indicates a logical low state. Additional reference voltages may be used based on a number of states capable of being stored in the targeted memory cell 14. The sense component 28 may include various transistors or amplifiers in order to detect and amplify a difference in the signals. The memory cell 14 may be set, or written, by activating the relevant word line 18 and digit line 26. As discussed above, activating a word line 18 electrically connects the corresponding row of memory cells 14 to their respective digit lines 26. By controlling the relevant digit line 26 while the word line 18 is activated, the memory cell 14 may be written—i.e., a memory state may be stored in the memory cell 14. The column decoder 30 may accept data, for example at input 32, to be written to the memory cells 14. The memory cell 14 may be written by applying a voltage across the ferroelectric capacitor of the memory cell 14. This process is discussed in more detail below.

In some cases, the memory cell 14 may be written after a read operation to write back data that has been read from the cell (or, alternatively, from other cells in some cases) or to refresh data. In some cases, a write operation may include writing a first charge (e.g., a first polarization charge) and a second charge (e.g., a dielectric compensation charge) to the memory cell 14. In some cases, writing one charge to the memory cell 14 may be based on a voltage of a cell plate relative to a voltage of one or more other components (e.g., a sense amplifier). In some cases, writing a first charge (e.g., a polarization charge) to a memory cell 14 may occur before, during an overlapping interval, or at the same time as writing the second charge (e.g., a dielectric compensation charge) to the memory cell 14. In some cases, a write operation may be based on setting a polarization state, a dielectric state, or both, or by flipping one or more digits using cell or component selection.

In some memory architectures, accessing the memory cell 14 may degrade or destroy the stored logic state and re-write or refresh operations may be performed to return the original logic state to the memory cell 14. In DRAM, for example, the capacitor may be partially or completely discharged during a sense operation, corrupting the stored logic state. As such, the logic state may be re-written after a sense operation. Additionally, activating a single word line 18 may result in the discharge of all memory cells 14 in the row; thus, several or all memory cells 14 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, the ferroelectric memory cells (e.g., memory cells 14) may have beneficial properties that may result in improved performance relative to other memory architectures.

The memory controller 16 may control the operation (e.g., read, write, re-write, refresh, etc.) of the memory cells 14 through the various components, such as the row decoder 24, the column decoder 30, and the sense component 28. The memory controller 16 may generate row and column address signals in order to activate the desired word line 18 and digit line 26. The memory controller 16 may also provide and control various voltage levels used during the access operations of the memory device 12. In general, the amplitude, shape, or duration of an applied voltage discussed herein may be adjusted or varied and may be different for the various operations for operating the memory system 8. Furthermore, one, multiple, or all memory cells 14 within the memory system 8 may be accessed simultaneously; for example, multiple or all cells of the memory system 8 may be accessed simultaneously during a reset operation in which all memory cells 14, or a group of memory cells 14, are set to a single logic state.

In some embodiments, refresh operations may be based on sensed data generated by sensors associated with memory. The memory controller 16 may be communicatively coupled to a first sensor 20 and the memory device 12 may include a second sensor 22 on a same chip as the memory device 12. The first sensor 20 may be thermally coupled to the memory controller 16 and the second sensor 22 may be thermally coupled to the memory device 12. For example, the first sensor 20 may be in thermal contact or include a component that is in thermal contact with the memory controller 16 and/or may be on a same board, chip, package, and the like, as the memory controller 16 is assembled. Similarly, the second sensor 22 may be in thermal contact with the memory device 12 and/or may be on a same board, chip, package, and the like, as the memory device 12 is assembled. In some cases, the first sensor 20 and/or the second sensor 22 may be thermally coupled to a portion of the board, chip, package or the like of the memory device 12 and/or memory controller 16. In case cases, the memory device 12 and/or the memory controller 16 may be physically wholly or partially disposed on, formed in, and/or integrated in the board, chip, package or the like. It is also noted that any manufacturing method may be used to form the first sensor 20, the second sensor 22, the memory device 12, and/or the memory controller 16 in general and/or to attach the component to the respective board, chip, package, or the like, including, for example, chemical vapor deposition (CVD), physical assembly, or the like. In any case, the first sensor 20 and the second sensor 22 may provide a temperature measurement that is indicative of a temperature of the memory device 12. Thus, the memory controller 16 may use an indication of the temperature from the first sensor 20 or from the second sensor 22 with a method to generally obtain the temperature of the memory device 12.

Figure 2:
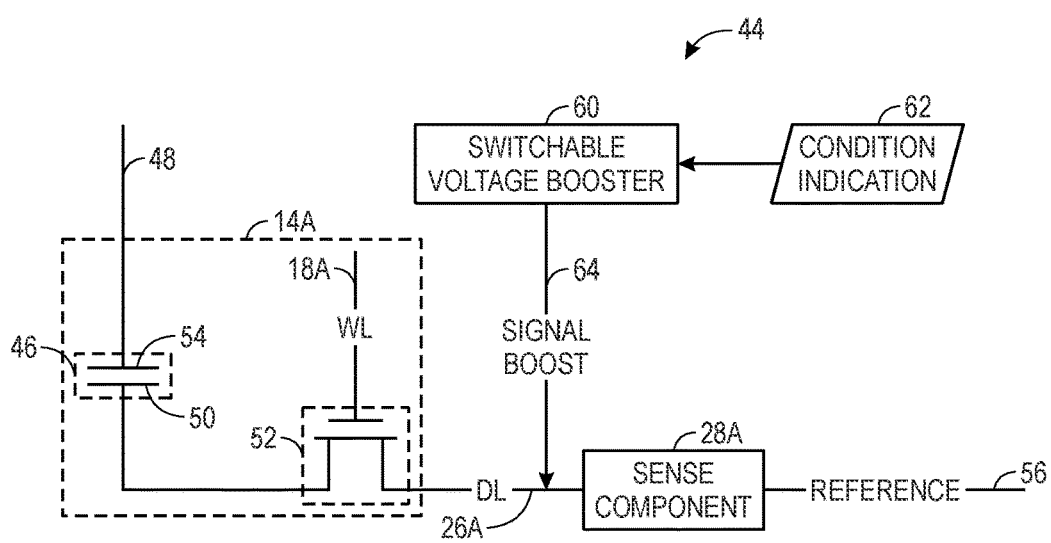
FIG. 2 illustrates an example circuit that supports accessing, sensing, and other operations of a memory via a switchable voltage booster, in accordance with an embodiment of the present disclosure.

FIG. 2 illustrates a circuit 44 that supports accessing, sensing, and other operations of the memory device 12 in accordance with various examples of the present disclosure. The circuit 44 includes an example ferroelectric memory cell 14 (e.g., memory cell 14A), word line 18A, digit line 26A, and sense component 28A, which may be examples of the memory cell 14, word line 18, digit line 26, and sense component 28, respectively, as described with reference to FIG. 1.

The ferroelectric memory cell 14A may include a logic storage component, such as a ferroelectric capacitor 46 that has a first plate, cell plate 54, and a second plate, cell bottom 50. The cell plate 54 and the cell bottom 50 may be capacitively coupled through a ferroelectric material positioned between them. The orientation of cell plate 54 and cell bottom 50 may be flipped without changing the operation of the ferroelectric memory cell 14A. The circuit 44 may also include a selection component 52 and reference voltages 56. In the example of FIG. 2, the cell plate 54 may be accessed via the plate line 48 and the cell bottom 50 may be accessed via the digit line 26A. As described above, various states may be stored by charging or discharging the ferroelectric capacitor 46.

The stored state of the ferroelectric capacitor 46 may be read or sensed by operating various elements represented in the circuit 44. The ferroelectric capacitor 46 may be in electronic communication with the digit line 26A. For example, the ferroelectric capacitor 46 can be isolated from the digit line 26A when the selection component 52 is deactivated, and the ferroelectric capacitor 46 can be connected to the digit line 26A when the selection component 52 is activated. Activating the selection component 52 may be referred to as selecting the ferroelectric memory cell 14A.

In some cases, the selection component 52 is a transistor and its operation is controlled by applying a voltage to the transistor gate, where the voltage magnitude is greater than the threshold magnitude of the transistor. The word line 18A may activate the selection component 52; for example, a voltage applied to the word line 18A is applied to the transistor gate, connecting the ferroelectric capacitor 46 with the digit line 26A.

A fixed or constant voltage may be applied to the cell plate 54 using the plate line 48. This operation may be referred to as "fixed cell plate." In order to read the memory state of a ferroelectric memory cell 14A, for example, the digit line 26A may be virtually grounded and subsequently isolated from virtual ground prior to applying a voltage to the word line 18A. Selecting the ferroelectric memory cell 14A may result in a voltage difference across the ferroelectric capacitor 46, since the plate line 48 is held at a finite voltage and the digit line 26A is virtually grounded. The voltage difference may be the induced voltage or sensed voltage discussed above. Moreover, the voltage difference value may refer to one of multiple sensing voltages, corresponding to one of multiple distinct charge distributions in the ferroelectric memory cell 14A, and indicative of the multiple memory states. As a result, the voltage of the digit line 26A may change (e.g., become some finite value). In some embodiments, this induced voltage may be compared at the sense component 28A with a first reference voltage and a second reference voltage of the reference voltages 56 to determine a memory state.

To write to the memory cell 14A, a voltage may be applied across the ferroelectric capacitor 46 to induce accumulation of the respective amount of charges. Various methods may be used to induce accumulation of the respective amount of charges. In one example, the selection component 52 may be activated through word line 18A in order to electrically connect the ferroelectric capacitor 46 to the digit line 26A. A voltage may be applied across the ferroelectric capacitor 46 by controlling the voltage of the cell plate 54 (through the plate line 48) and the cell bottom 50 (through the digit line 26A). The differential voltage between the cell plate 54 and the cell bottom 50 may be driven to the first sensing voltage to write the first memory state. A similar process may be performed to write the second memory state.

Keeping the foregoing in mind, a FeRAM memory device (e.g., memory system 8) may include a switchable voltage booster 60 that provides a signal boost (e.g., a boosted voltage signal) to a portion of the memory array 10 (e.g., memory cell 14A) based on a condition to improve data access otherwise affected by the condition. Here, the switchable voltage booster 60 receives a condition indication 62. Based on the condition indication 62, the switchable voltage booster 60 transmits the signal boost 64 to the digit line 26A.

The condition indication 62 may be generated in response to temperature changes, or other conditions (e.g., process conditions, environmental conditions, material conditions). The memory controller 16 may receive sensing data from the sensor 20 and compare the sensing data to thresholds to identify when changes in temperature occur that are to be compensated for via the signal boost 64. As noted above, by selectively applying the signal boost 64 during low temperature periods, access read speeds may be maintained or increased despite a variable operating temperature. Furthermore, by selectively applying the signal boost 64, timing improvements may be achieved without additional power consumption burdens since the signal boosting is performed in response to conditions that are to be mitigated and not necessarily all the time during operation. In other words, the signal booster does not apply the signal boost 64 when conditions are present that do not affect access speeds.

The condition indication 62 may include a control signal that operates a switch or instructs the switchable voltage booster 60 to change an output or a value of the signal boost 64. When not present, the switchable voltage booster 60 may generate no output. In some cases, the switchable voltage booster 60 may receive sensing data and determine on its own to generate the signal boost 64 without receiving the condition indication 62 from the memory controller 16.

Figure 3:
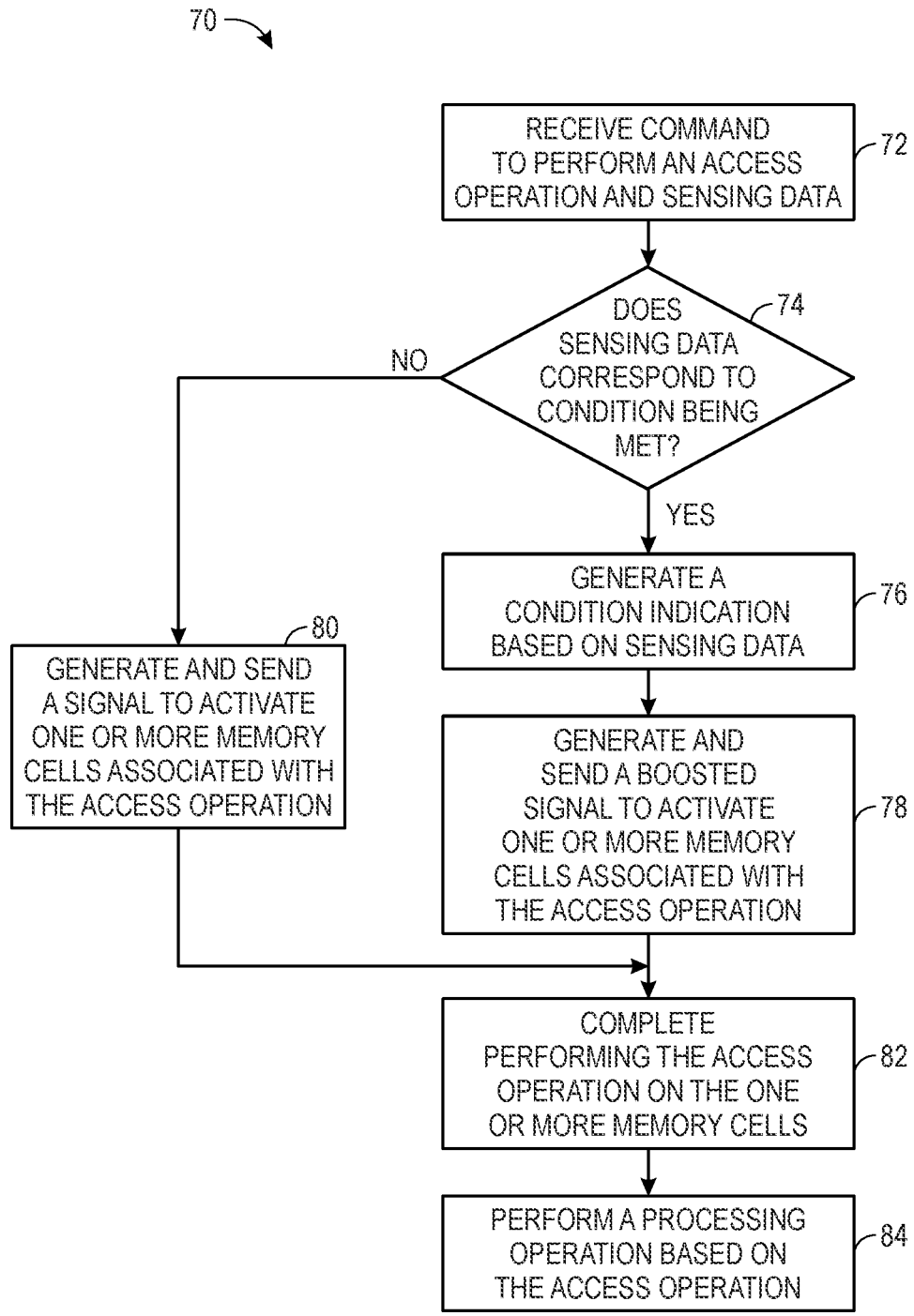
FIG. 3 illustrates a flowchart of a method of performing a memory access operation based on the switchable voltage booster of FIG. 2, in accordance with an embodiment of the present disclosure.

To elaborate, FIG. 3 illustrates a flowchart of a method 70 of performing a memory access operation based on the switchable voltage booster 60. Although the method 70 is shown as involving operations in a particular order, it should be understood that some of the operations may be performed in a different order and certain operations described may be omitted from being explicitly shown in a block as part of FIG. 3 and instead described herein. Furthermore, the operations of the method 70 are described as performed by the memory controller 16. However, it should be understood that other suitable processing circuitry of an electronic device communicatively coupled to the memory device 12 may perform some or all of the operations represented via the method 70.

At block 72, the memory controller 16 may receive a command that instructs an access operation and sensing data from the sensor 20. That is, the memory controller 16 may receive a command or otherwise determine to access data stored in one or more memory cells 14 in association with a read operation, a write operation, or a refresh operation. The access operation may correspond to a destructive read operation and thus be paired with a write operation that causes the writing of new or repeated data. The memory controller 16 may receive the command from another portion of the memory system 8 and/or a corresponding host device. The memory controller 16 may receive the sensing data from the sensor 20 and/or another sensor 22 disposed within the memory system 8 and/or the corresponding host device, or may read the sensing data from a register that one or more sensors 20, 22 write data.

At block 74, the memory controller 16 may determine if the sensing data corresponds to a condition being met and, if so, the memory controller 16 may, at block 76, generate a condition indication 62 based on the sensing data. The memory controller 16 may do so by comparing the sensing data to expected data values, ranges, or threshold values to determine whether the sensing data indicates that the memory device 12 is experiencing temperature changes, or other conditions (e.g., process conditions, environmental conditions, material conditions). A threshold value is used to determine that the memory device 12 experiences temperature changes or other conditions. For example, the threshold value may correspond to 30° C., where below the threshold value, the memory controller 16 generates the condition indication 62 that triggers generation of a boosted control signal or voltage.

At block 78, the memory controller 16 may operate the switchable voltage booster 60 to generate and send a boosted control signal or voltage associated with the signal boost 64 and may cause the boosted control signal or voltage to activate one or more memory cells 14 associated with the access operation. The memory controller 16 may determine which memory cells 14 to activate based on the access operation, and thus the boosted control signal or voltage may be selectively transmitted to the memory cells 14 to be activated. The boosted control signal or voltage (e.g., signal boost 64) may charge the digit line 26A, as shown in FIG. 2.

If, at block 74, the memory controller 16 determines that the sensing data does not satisfy a condition, at block 80, the memory controller 16 may generate and send a normal control signal (e.g., a voltage having a lower voltage level than that generated via the switchable voltage booster 60 in association with block 78) to activate one or more memory cells 14 associated with the access operation. In other words, when the condition is not met, the memory controller 16 is not operating the switchable voltage booster 60 to generate the signal boost 64. For example, when the one or more memory cells 14 are at a suitably hot temperature, no voltage boost may be used to adjust cell read speeds since the read speed may already be fast enough at relatively higher temperatures (e.g., temperatures above a threshold).

At block 82, the memory controller 16 may complete performing the access operation based on the one or more memory cells 14 receiving the generated boosted control signal or voltage of block 78 or the control signal of block 80. Performing the access operation may involve reading and/or writing data from the memory cells 14 activated at block 78 or block 80. Performing the access operation may involve performing a destructive read of data from the memory cells 14, followed by a write of the same data or different data to the memory cells 14 activated based on the generated boosted control signal or voltage.

At block 84, the memory controller 16 may perform a processing operation based on the access operation and/or data received via the access operation. Indeed, the memory controller 16 may process data received from the access operation and/or may perform additional operations to prepare for subsequent memory access operations. The additional operations may be contingent on data received from the access operation and/or be based on successful completion of the access operation. For example, the additional operation may be that the memory controller 16 precharges one or more memory cells 14 before performing an additional memory access operation.

Figure 4:
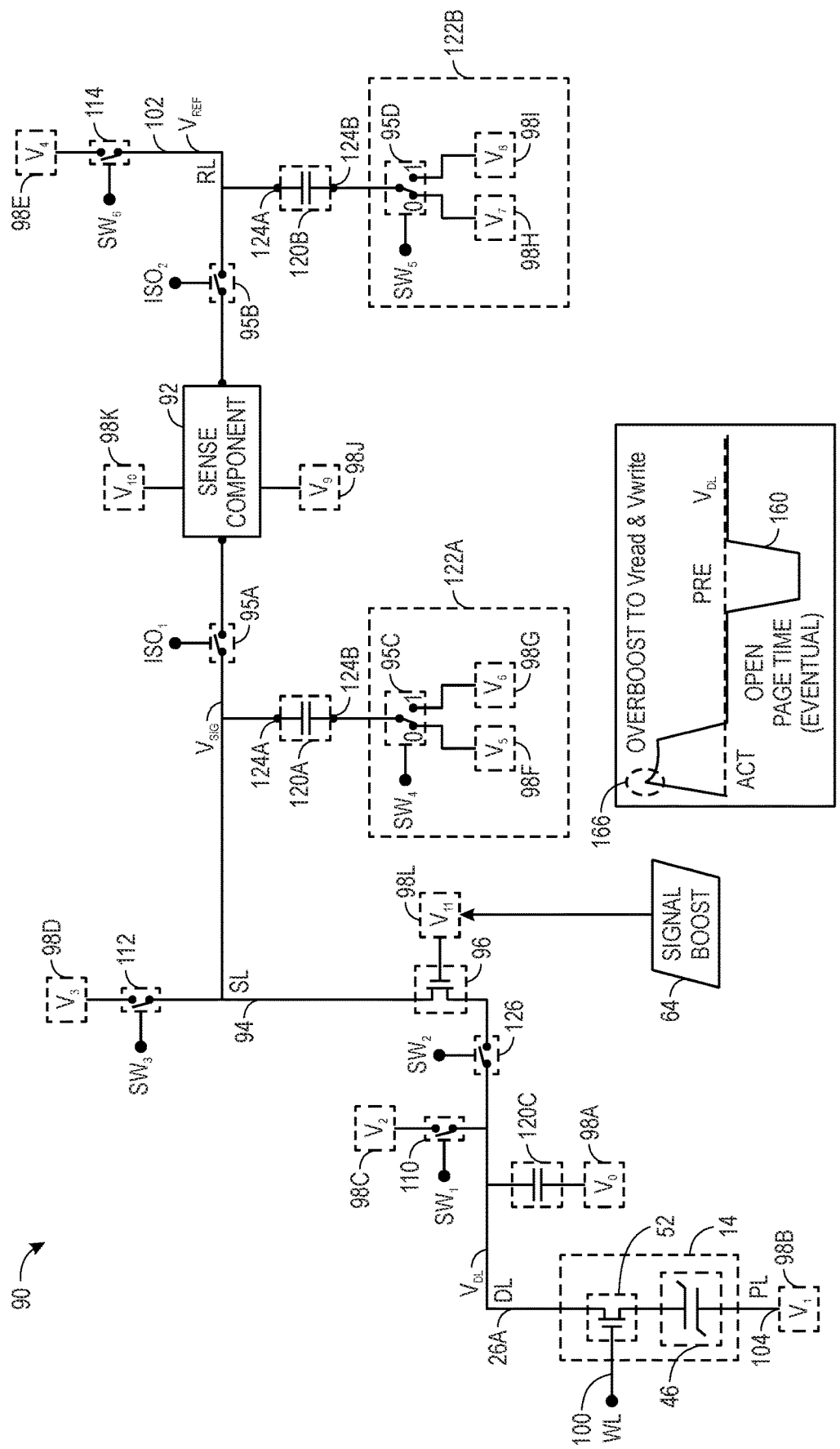
FIG. 4 illustrates an example circuit of the circuit of FIG. 2 that includes a sense amplifier for sensing a logic state of the memory cell of FIG. 2, in accordance with an embodiment of the present disclosure.
Figure 5:
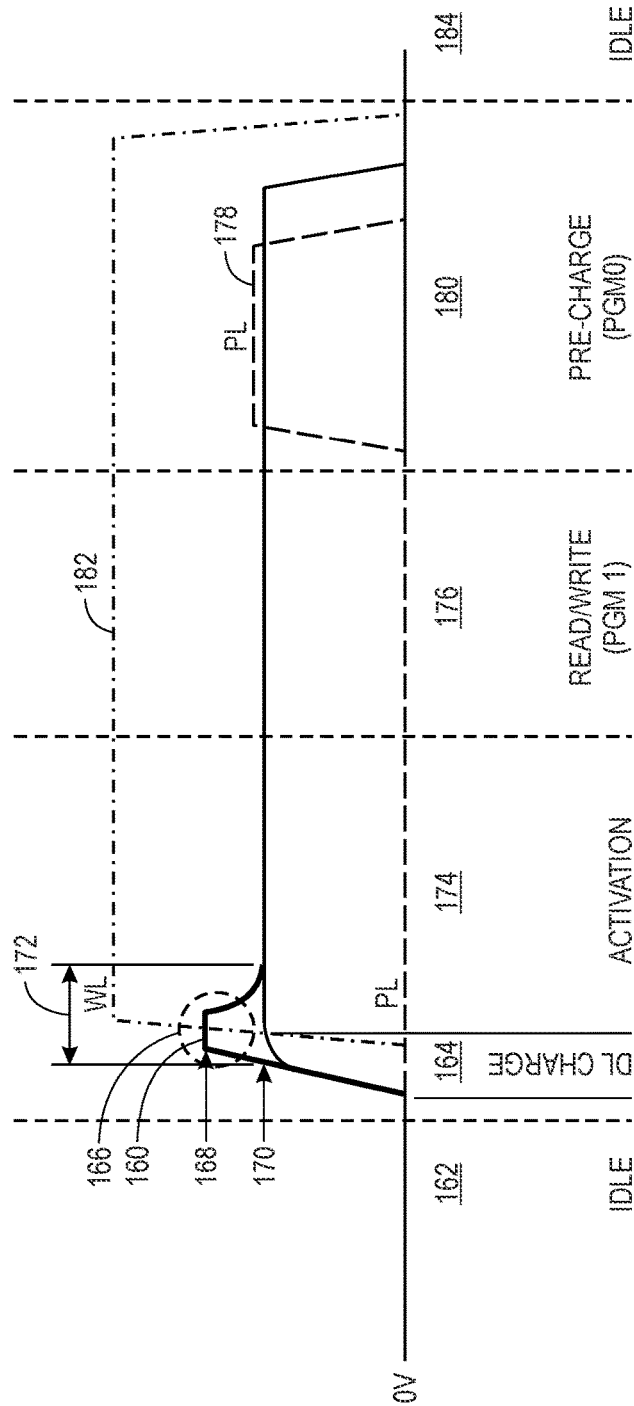
FIG. 5 illustrates a timing diagram corresponding to switchable voltage booster operations associated with the circuit of FIG. 4, in accordance with an embodiment of the present disclosure.
Figure 6:
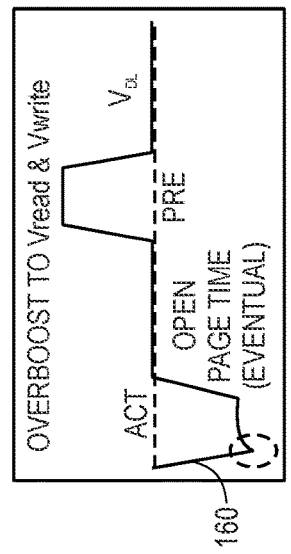
FIG. 6 illustrates a plot of the signal boost of FIG. 2 as a negative voltage, in accordance with an embodiment of the present disclosure.

FIGS. 4-6 describe specific examples of the systems and methods of FIG. 2-3. FIG. 4 is a sample circuit 90 of a portion of the memory array 10 corresponding to sensing circuitry and a memory cell 14, and FIG. 5 is a timing diagram of control signals associated with an example access operation corresponding to that described in FIG. 3 and FIG. 4. For sake of concise description, FIG. 4 and FIG. 5 are referred to together below to describe further an example access operation and boosted signals generated in association with the access operation. Both FIG. 4 and FIG. 5 illustrate a digit line voltage 160 affected by the signal boost 64 of FIG. 2. The signal boost 64 may be a voltage applied to a gate of an amplifier 96, shown in FIG. 4 as a switch. This voltage applied may change characteristics of the digit line voltage ($V_{DL}$) on the digit line 26A.

FIG. 4 illustrates an example of a circuit 90 that includes a sense amplifier 92 for sensing a logic state of a memory cell 14. It is noted that circuit 90 may generally correspond to circuit 44 of FIG. 2. For example, switchable voltage booster 60 may generate and send the signal boost 64 to voltage source 98L to be applied to the digit line 26A, paralleling the signal boost 64 operations of the switchable voltage booster 60 of FIG. 2. Electrical charge or other signals may be communicated between the sense amplifier 92 and the memory cell 14 over a digit line 26A and a signal line 94, which may, in combination, be referred to as a single access line of the memory cell 14. Signals of the access line may be illustrated by voltage $V_{DL}$ on the digit line 26A, and $V_{SIG}$ on the signal line 94, as shown.

An amplifier 96 may be coupled between the digit line 26A and the signal line 94, which may be enabled by voltage source 98L. The amplifier 96 may be an example of a signal development component that may amplify or otherwise convert signals of the digit line 26A prior to a sensing operation. A word line 100 may be used to select or deselect the memory cell 14 (e.g., by way of logic signal WL) and a reference line 102 may provide a reference signal (e.g., $V_{REF}$, as shown) to compare to a signal of the signal line 94 while detecting a logic state of the memory cell 14. The circuit 90 may also include a plate line 104 (PL) for accessing a cell plate of a capacitor of the memory cell 14. In this way, the memory cell 14 may be coupled between a first access line (e.g., the digit line 26A and the signal line 94) and a second access line (e.g., the plate line 104).

The circuit 90 may include various voltage sources 98 (voltage source 98A, voltage source 98B, voltage source 98C, voltage source 98D, voltage source 98E, voltage source 98F, voltage source 98G, voltage source 98H, voltage source 98I, voltage source 98J, voltage source 98K, voltage source 98L), which may be coupled with various voltage supplies or common grounding or virtual grounding points of a memory device that includes the example circuit 90.

A voltage source 98A may couple to a common ground, which may be associated with a common reference voltage having a voltage V0 from which other voltages are defined. The voltage source 98A may be coupled with the digit line 26A via the intrinsic capacitance 120C of the digit line 26A.

The voltage source 98B may have a voltage V1 and be a plate line voltage source. The voltage source 98B may be coupled with the memory cell 14 via a plate line 104 of the memory cell 14. In some examples, the voltage source 98B may be controlled for access operations such as read or write operations. Indeed, the voltage source 98B may be a variable voltage source, where a voltage V1 may have multiple levels.

The voltage source 98C may have a voltage V2 and may be a digit line voltage source. The voltage source 98C may be coupled with the digit line 26A via a switching component 110, which may be activated or deactivated by a logical signal SW1.

A voltage source 98D may have a voltage V3 and may be a signal line precharge voltage source. The voltage source 98D may be coupled with the signal line 94 via a switching component 112, which may be activated or deactivated by a logical signal SW3.

The voltage source 98E may have a voltage V4 and may be a reference signal voltage source. The voltage source 98E may be coupled with the reference line 102 via a switching component 114, which may be activated or deactivated by a logical signal SW6.

The voltage source 98L may have a voltage V11 and may be an amplifier or a cascode voltage source (e.g., a transistor configured in a cascode arrangement). The voltage source 98L may be coupled with the amplifier 96. In some examples, the amplifier 96 may be a transistor, and the voltage source 98L may be coupled with the gate of the transistor. The amplifier 96 may be coupled with the signal line 94 at a first terminal, and the digit line 26A at a second terminal. The amplifier 96 may provide a conversion of charge, voltage, or other signals between the digit line 26A and the signal line 94.

The amplifier 96 may permit a flow of charge (e.g., electrical charge, electrical current) from the signal line 94 to the digit line 26A, as fed or enabled by the voltage source 98L, upon a reduction in voltage of the digit line 26A (e.g., upon selection of the memory cell 14).

The circuit 90 may also include a first integrator capacitor 120A and a second integrator capacitor 120B, which may each be coupled with a respective variable voltage source 122 (variable voltage source 122A, variable voltage source 122B). For example, the first integrator capacitor 120A may be coupled with the signal line 94 at a first terminal 124A, and coupled with a variable voltage source 122-a at a second terminal 124B. The second integrator capacitor 120B may be coupled with the reference line 102 at a first terminal 124A, and coupled with a variable voltage source 122B at a second terminal 124B.

A flow of charge across the amplifier 96 may be accompanied by a change in voltage of the signal line 94. For example, when the signal line 94 is not otherwise coupled with a voltage source, a relatively small flow of charge to the digit line 26A may be associated with a relatively small change in voltage of the signal line 94, whereas a relatively large flow of charge to the digit line 26A may be associated with a relatively large change in voltage of the signal line 94. Changes in voltage of the signal line 94 associated with an access operation may be based on the net capacitance of the signal line 94 (e.g., including the integrator capacitor 120A), where the signal line 94 may undergo a relatively small change in voltage or a relatively large change in voltage depending on the flow of charge across the amplifier 96 after selecting the memory cell 14.

In various examples, the amplifier 96 may be referred to as a "voltage regulator" or a "bias component," relating to how the amplifier 96 regulates a flow of charge in response to the voltage or charge transfer of the digit line 26A. In some examples, the amplifier 96, or combination of the amplifier 96 and the integrator capacitor 120A, may be referred to as a charge transfer sensing amplifier. The amplifier 96 may be isolated from the digit line 26A by a switching component 126, which may be activated or deactivated by a logical signal SW2. In some examples, the switching component 126 may be part of a memory column, a multiplexer, or some other circuitry configured to selectively couple the digit line 26A with the amplifier 96 or the signal line 94.

Although circuit 90 is shown as including two variable voltage sources 122, some configurations in accordance with the present disclosure may include a single, common variable voltage source 122. For example, a first voltage source 98 of a common variable voltage source 122 may be coupled with both the second terminal 124B of the first integrator capacitor 120A and the second terminal 124B of the second integrator capacitor 120B when a switching component of the common variable voltage source 122 is deactivated, and a second voltage source 98 of the common variable voltage source 122 may be coupled with both the second terminal 124B of the first integrator capacitor 120A and the second terminal 124B of the second integrator capacitor 120B when the switching component of the common variable voltage source 122 is activated. In other examples, a variable voltage source 122 may be replaced with fixed voltage sources, or other types of voltage sources, or omitted altogether.

In some examples, the voltage sources 98J and 98K may be selected according to particular input/output parameters. For example, voltage sources 98J and 98K may be substantially at 0 volts (V) and 1V, respectively, in accordance with certain input/output component conventions such as some DRAM conventions. Although voltage sources 98 may be coupled with common voltage supplies or grounding points, the voltage of each of the voltage sources 98 coupled with a common voltage supply or common grounding point may be different due to various differences (e.g., conductor length, width, resistance, capacitance) between the respective voltage sources 98 and the associated common voltage supply or common grounding point.

The voltage source 98E may provide a reference voltage for sensing the logic state of the memory cell 14. For example, a voltage of V4 may be configured to be an average between signal line voltages associated with sensing a logic 1 and a logic 0. In some examples, a voltage of V4 may be provided as a voltage dropped from a voltage supply of the memory device, which may be the same voltage supply coupled with other voltage sources 98. For example, V4 may be provided by connecting voltage source 98E with a same voltage supply as voltage source 98D, but with an intervening electrical load (e.g., a resistive load or capacitance) between the voltage supply and the voltage source 98E).

Referring to FIG. 5, FIG. 5 is a timing diagram that illustrates some of the signals received by circuit 90 of FIG. 4. It is noted that FIGS. 4 and 5 correspond to one example that may be used to boost memory read control signals to increase read speeds and that other arrangements may be used.

FIG. 5 shows a digit line voltage 160 (e.g., corresponding to a V11 voltage) that corresponds to the voltage received via the voltage source 98L over time as part of a memory access operation. For each of the time periods illustrated or discussed herein, a counter may track memory cycles and/or clock pulses as method to track a passage of time relative to the time period definition.

To elaborate, at a first time period 162, the circuit 90 is idle and the voltage (V11) output via the voltage source 98L may equal 0 volts (V). During a second time period 164, a change in the digit line voltage 160 ($V_{DL}$) is triggered to activate the memory cell 14. To increase an access (e.g., read, write) speed, the circuit 90 may receive the signal boost 64 of FIG. 2 via the voltage source 98L. This signal boost 64 of FIG. 2 may correspond to a pulse in the V11 voltage, manifesting as a pulse 166 in the digit line voltage 160. The V11 voltage may be increased causing an increase in the digit line voltage 160 to a boosting level 168 before returning to a voltage level 170 for the remainder of the access operation. The voltage level 170 may correspond to a first voltage value and the boosting level 168 may correspond to a second voltage value greater than the voltage level 170. At the end of a pulse duration 172, during an activation time period 174, the V11 value may be reduced to cause the digit line voltage 160 to settle from the boosting level 168 to the voltage level 170. During a read/write time period 176, voltage levels of the V11 signal and a voltage output from the voltage source 98A, V1 signal, remain relatively constant (e.g., negligible variation), causing the digit line voltage 160 and a plate line voltage 178 to remain relatively constant until a pre-charge time period 180. At the pre-charge time period 180, the V1 signal changes value to approximately the logical high voltage level 170 causing a change in the plate line voltage 178 while the V11 signal, and thus the digit line voltage 160, remains at the voltage level 170. A word line (WL) control signal 182 applied via word line 100 in FIG. 4 may be maintained at a relatively high voltage value (e.g., a voltage value greater than the voltage level 170) for approximately the duration of time corresponding to the activation time period 174, the read/write time period 176, and the pre-charge time period 180. After completing the memory access operation, the circuit 90 may return the digit line voltage 160, the plate line voltage 178, and the WL control signal 182 to a 0V level and enter an idle period 184 until a next memory access operation.

As described above, the signal boost 64 may be a positive voltage signal that temporarily elevates a value of the signal transmitted as V11 at the amplifier 96, such as when temperatures are low enough to be desired to be compensated. FIG. 6 is a plot that illustrates that the signal boost 64 as a negative voltage. Indeed, the signal boost 64 may be a negative voltage signal used to affect the digit line voltage 160. The signal boost 64 of FIG. 6 may be used as the V11 signal when the amplifier 96 is activated in response to negative voltage levels as opposed to positive voltage levels.

In some cases, the memory controller 16 may determine to access sensing data to determine a temperature in response to determining to perform an access operation. In some cases, the memory controller 16 may periodically track operating conditions. The memory controller 16 may determine to generate the condition indication 62 based on indications of the tracked operating conditions, like temperature. Tracking operating conditions over time may be relatively more efficient when compared to determining the temperature at each memory access command since sensing operations may be scheduled or performed less frequently.

These systems and methods described herein may improve memory operations by compensating for changes in access speeds caused by changes in operating conditions of a memory device, such as changes in temperature of the memory device. To compensate for the access speed changes, a memory controller may detect the change and, in response to the change, may increase digit line voltage while the changed condition is present. For example, while a temperature associated with a memory device is relatively cold, the memory controller may increase a voltage value of the digit line and once the temperature returns to a warmer level, the memory controller may return the voltage value of the digit line to a normal, lower voltage value once the boost to the digit line is no longer desired. By selectively changing a reading voltage value in response to a temperature, power consumed by the memory device may be conserved due to the memory controller not operating the memory device in the boosted state indiscriminately. By doing so, cell read speeds may be temporarily increased while the temperature is cold enough to impede read speeds impeded and not when the temperature is warm enough to not impede read speeds, thereby compensating for any slow in read speed occurring from the temperature changes without substantially increasing power consumed. Similar operations may be performed to compensate temporarily reduced speeds caused by other changes in temperatures, changes in pressure or other operating conditions, or the like. These systems and methods may be applied to a variety of memory devices including both two-dimensional memories and/or three-dimensional memories (e.g., cross-point memories) to improve robustness of operations of the different memory devices.

With these technical effects in mind, multiple memory devices may be included on a memory module, thereby enabling the memory devices to be communicatively coupled to the processing circuitry as a unit. For example, a dual in-line memory module (DIMM) may include a printed circuit board (PCB) and multiple memory devices. Memory modules respond to commands from a memory controller communicatively coupled to a client device or a host device via a communication network. Or in some cases, a memory controller may be used on the host-side of a memory-host interface; for example, a processor, microcontroller, field programmable gate array (FPGA), application-specific integrated circuit (ASIC), or the like may each include a memory controller.

This communication network may enable data communication there between and, thus, the client device to utilize hardware resources accessible through the memory controller. Based at least in part on user input to the client device, processing circuitry of the memory controller may perform one or more operations to facilitate the retrieval or transmission of data between the client device and the memory devices. Data communicated between the client device and the memory devices may be used for a variety of purposes including, but not limited to, presentation of a visualization to a user through a graphical user interface (GUI) at the client device, processing operations, calculations, or the like. Thus, with this in mind, the above-described improvements to memory, memory controller operations, and memory writing operations may manifest as improvements in visualization quality (e.g., speed of rendering, quality of rendering), improvements in processing operations, improvements in calculations, or the like.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 20(f). However, for any claims containing elements designated in any other manner, it is intended that such elements are not to be interpreted under 35 U.S.C. 20(f).

What is claimed is:

1. A system, comprising:
a memory cell configured to be supplied a first voltage less than a second voltage; and
a memory controller communicatively coupled to the memory cell, wherein the memory controller is configured to:
receive a signal that indicates an operating condition affecting the memory cell;
determine to supply the second voltage as opposed to the first voltage based on the signal;
supply the second voltage to the memory cell for a first duration of time; and
after the first duration of time, supply the first voltage to the memory cell for a second duration of time; and
an amplifier configured to couple to a digit line associated with the memory cell, wherein the amplifier generates the first voltage during the second duration of time and the second voltage during the first duration of time.

2. The system of claim 1, wherein the memory cell comprises a ferroelectric random access memory (FeRAM) memory cell.

3. The system of claim 1, wherein the operating condition corresponds to an indication of temperature.

4. The system of claim 1, wherein the first voltage corresponds to a logic high voltage associated with the memory cell.

5. The system of claim 1, wherein the first duration of time corresponds to a portion of an activation operation.

6. The system of claim 5, wherein the second duration of time corresponds to another portion of the activation operation.

7. The system of claim 6, wherein the activation operation corresponds to a memory access command.

8. The system of claim 1, wherein the memory cell is configured to couple between a first access line comprising the digit line and a second access line.

9. A memory device comprising:
a switchable voltage booster configured to selectively provide a first voltage, a second voltage, and a third voltage, wherein the third voltage is greater than the second voltage and the first voltage; and
a memory controller configured to cause the switchable voltage booster to output one of the first voltage, the second voltage, and the third voltage to a digit line, wherein the first voltage corresponds to a logic low voltage, wherein the second voltage corresponds to a logic high voltage, and wherein the third voltage is greater than the logic high voltage.

10. The memory device of claim 9, comprising:
a memory cell; and
an amplifier coupled to the memory cell via the digit line, wherein the amplifier is configured to receive the first voltage, the second voltage, and the third voltage from the switchable voltage booster and adjust an output to the digit line in response to the first voltage, the second voltage, and the third voltage.

11. The memory device of claim 10, wherein the amplifier is configured to have a faster switching speed when receiving the third voltage relative to a switching speed responsive to receiving the second voltage or the first voltage.

12. The memory device of claim 10, wherein the memory controller is configured to:
receive a signal that indicates a temperature;
determine to supply the third voltage as opposed to the first voltage or the second voltage based on the signal;
supply the third voltage to the memory cell for a first duration of time; and
after the first duration of time, supply the second voltage to the memory cell for a second duration of time; and
after the second duration of time, supply the third voltage to the memory cell.

13. The memory device of claim 9, wherein the switchable voltage booster is configured to provide the third voltage based on an indication of temperature.

14. A method, comprising:
determining to generate a signal boost for a first duration of time;
in response to determining to generate the signal boost, operating an amplifier to generate a pulse by increasing a first voltage of a digit line to a second voltage greater than a logic high voltage, wherein the digit line is configured to couple between a portion of a ferroelectric random access memory (FeRAM) memory cell and a sense component; and
after the first duration of time, operating the amplifier to stop generation of the pulse.

15. The method of claim 14, comprising:
receiving a memory access command;
determining to perform an access operation based on the memory access command; and
in response to determining to perform the access operation, generating the signal boost.

16. The method of claim 15, wherein determining to generate the signal boost for the first duration of time comprises:
receiving an indication of an operating condition affecting the FeRAM memory cell; and
determining to generate the signal boost based on the operating condition.

17. The method of claim 16, comprising generating the second voltage less than the first voltage.

18. The method of claim 16, wherein the operating condition is a temperature of the FeRAM memory cell.

19. The method of claim 16, comprising:
determining to perform the access operation on the FeRAM memory cell;
receiving a signal indicating a temperature associated with the FeRAM memory cell as the operating condition;
determining to generate the signal boost for the first duration of time based on the signal; and
after the first duration of time, supplying the second voltage to the FeRAM memory cell for a second duration of time, wherein the first duration of time and the second duration of time together correspond to a duration of time allocated for performing the access operation.

20. The method of claim 14, wherein determining to generate the signal boost for the first duration of time comprises determining to generate the signal boost for the first duration of time based on a process condition, an environmental condition, a material condition, or a combination thereof.

\* \* \* \* \*